United States Patent [19]
Kuriyama

[11] Patent Number: 5,504,647
[45] Date of Patent: Apr. 2, 1996

[54] SOLID ELECTROLYTIC CAPACITOR HAVING A FUSE WIRE PARTIALLY ENCLOSED IN AN ELASTIC RESIN

[75] Inventor: Chojiro Kuriyama, Kyoto, Japan

[73] Assignee: Rohm Co., Ltd., Kyoto, Japan

[21] Appl. No.: 361,212

[22] Filed: Dec. 21, 1994

[30] Foreign Application Priority Data

Dec. 27, 1993 [JP] Japan .................................. 5-331292

[51] Int. Cl.[6] ...................................................... H01G 2/16
[52] U.S. Cl. ............................................................ 361/534
[58] Field of Search ...................................... 361/523, 528, 361/529, 532, 534, 275.1–275.4; 29/25.03

[56] References Cited

U.S. PATENT DOCUMENTS

| | | | |
|---|---|---|---|
| 4,935,848 | 6/1990 | Yamane et al. | 361/534 |
| 5,053,927 | 10/1991 | Baker et al. | 361/534 |
| 5,057,973 | 10/1991 | Gouvernelle et al. | 361/534 |
| 5,177,674 | 1/1993 | Sugisaki | 361/534 |
| 5,315,474 | 5/1994 | Kuriyama | 361/534 |

FOREIGN PATENT DOCUMENTS

| | | | |
|---|---|---|---|
| 1-291417 | 11/1989 | Japan | 361/534 |
| 2105513 | 4/1990 | Japan | H01G 9/12 |

*Primary Examiner*—Bot L. Ledynh
*Attorney, Agent, or Firm*—Michael D. Bednarek; Marks & Murase

[57] ABSTRACT

A solid electrolytic capacitor that includes a capacitor element including a chip and an anode wire projecting from a first end face of the chip. The chip has a second end face opposite to the first end face and a side face between the first and second end faces. An anode lead is electrically connected to the anode wire and a cathode lead is paired with the anode lead. The capacitor also includes a safety fuse wire that has a first end electrically connected to the side face of the chip, and a second end electrically connected to the cathode lead. A resin package encloses the capacitor element, part of the anode lead, part of the cathode lead, and the fuse wire. An insulating layer is formed at least on the side face of the chip adjacent to the second end face thereof for contacting and supporting the safety fuse wire.

5 Claims, 4 Drawing Sheets

SOLID ELECTROLYTIC CAPACITOR HAVING A FUSE WIRE PARTIALLY ENCLOSED IN AN ELASTIC RESIN

BACKGROUND OF THE INVENTION

1. Field of the Invention

This invention relates to a solid electrolytic capacitor, such as tantalum capacitor or aluminum capacitor, which incorporates a safety fuse wire in addition to a capacitor element.

2. Description of the Related Art

A solid electrolytic capacitor (e.g. tantalum capacitor) is known to generate a large amount of heat upon passage of an overcurrent which might be caused by an insulation failure for example. Further, since the solid electrolytic capacitor is a polar element, it also generate a lot of heat if mounted on a circuit board with reverse polarity.

To prevent such heat generation, therefore, it has been proposed to incorporate a built-in safety fuse wire in a resin package of the solid electrolytic capacitor, as disclosed in Japanese Patent Application Laid-open No. 2(1990)-105513 for example. For the convenience of description, such a capacitor is illustrated in FIGS. 6 through 8 of the accompanying drawings.

As shown in FIG. 6, a prior art fused solid electrolytic capacitor comprises a capacitor element 1 which includes a capacitor chip 2 and an anode wire 3. The capacitor chip 2 has a first end face 2a from which the anode wire 3 projects out, a second end face 2b opposite to the first end face 2b, and an upper side face 2c between the first and second end faces 2a, 2b. The anode wire 3 is electrically connected to an anode lead 4 by welding, whereas the side face 2c of the chip 2 is electrically connected to a cathode lead 5 through a safety fuse wire 6 partially enclosed in a relatively soft elastic resin member 7. All of these components are enclosed in a package 8 of a synthetic resin with the respective leads 4, 5 partially projecting therefrom, and the projecting portions of the respective leads 4, 5 are bent toward the underside of the package 8 for conveniently mounting to a surface of a printed circuit board (not shown).

According to the arrangement described above, the fuse wire 6 is bonded to the upper side face 2c of the chip 2 at a position close to the second end face 2b thereof. Thus, the cathode lead 5 need be sufficiently spaced from the second end face 2b of the chip 2 to make sure that the fuse wire 6 has a sufficient length S as required for providing an intended breaking (melting) property. As a result, the length L' of the capacitor must be inevitably increased.

Further, due to the large spacing between the chip 2 and the cathode lead 5, it becomes difficult to locate an intermediate portion of the fuse wire 6 close to the chip 2. Thus, when used as a temperature fuse, the fuse wire 6 cannot be made sufficiently sensitive to the heat of the chip 2.

The above-described problems of the prior art solid electrolytic capacitor can be reduced by bonding one end of the fuse wire 6 to the upper side face 2c of the chip 2 at a position reasonably spaced from the second end face 2b of the chip 2 and by making the fuse wire 6 to extend along an upwardly curved path with a vertical spacing W' from the upper side face 2c of the chip 2, as shown in FIGS. 7 and 8. However, this solution gives rise to the following new problems.

Before partially enclosing the fuse wire 6 in the soft elastic resin member 7 followed by subsequent formation of the resin package 8, the fuse wire 6 may gravitationally sag down toward the upper side face 2c of the chip 2, as indicated by phantom lines in FIG. 8. In an extreme case, the fuse wire 6 may come into direct contact with the chip 2.

When used as a temperature fuse wire, since the melting property of the fuse wire 6 varies depending on the spacing from the chip 2, the sagging of the fuse wire results in a variation of the melting property. When used as an overcurrent fuse, on the other hand, the effective length of the fuse wire 6 greatly reduces if the fuse wire 6 sags into direct contact with the chip 2, consequently failing to provide an intended fusing function.

It is conceivable to increase the initial spacing W' between the chip 2 and the fuse wire 6 for avoiding direct contact between the two even upon sagging. However, this countermeasure results in a corresponding increase of the thickness dimension R' of the package portion above the upper side face 2c of the chip 2, so that the height H' of the resin package 8 must also be increased.

SUMMARY OF THE INVENTION

It is, therefore, an object of the present invention to provide a solid electrolytic capacitor which is capable of eliminating or reducing the above-described problems.

According to the present invention, there is provided a solid electrolytic capacitor comprising: a capacitor element including a chip and an anode wire projecting from a first end face of the chip, the chip having a second end face opposite to the first end face and a side face between the first and second end faces; an anode lead electrically connected to the anode wire; a cathode lead paired with the anode lead; a safety fuse wire having a first end electrically connected to the side face of the chip, and a second end electrically connected to the cathode lead; and a resin package enclosing the capacitor element, part of the anode lead, part of the cathode lead, and the fuse wire; wherein an insulating layer is formed at least on the side face of the chip adjacent to the second end face thereof for contacting and supporting the safety fuse wire.

Preferably, the fuse wire may have a horizontal portion extending substantially in parallel to the side face of the chip in contact with the insulating layer, and a vertical portion extending substantially perpendicularly to the cathode lead.

The insulating layer may be made to also cover the second end face of the chip. In this case, the cathode lead may be held in direct contact with the insulating layer, and the first end of the fuse wire may be bonded to the side face of the chip at a position closer to the first end face than to the second end face.

According to a preferred embodiment of the present invention, the fuse wire is partially enclosed in an elastic resin member.

Other objects, features and advantages of the present invention will be fully understood from the following detailed description given with reference to the accompanying drawings.

DETAILED DESCRIPTION OF THE PREFERRED EMBODIMENTS

Figure 1:
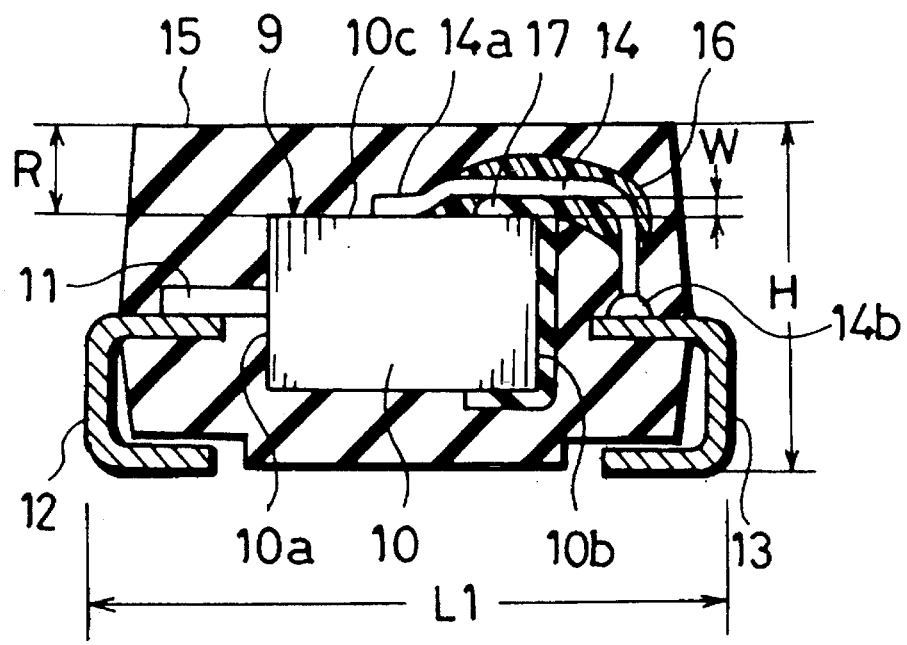
FIG. 1 is a front view, in vertical section, showing a solid electrolytic capacitor according to a first embodiment of the present invention.
Figure 2:
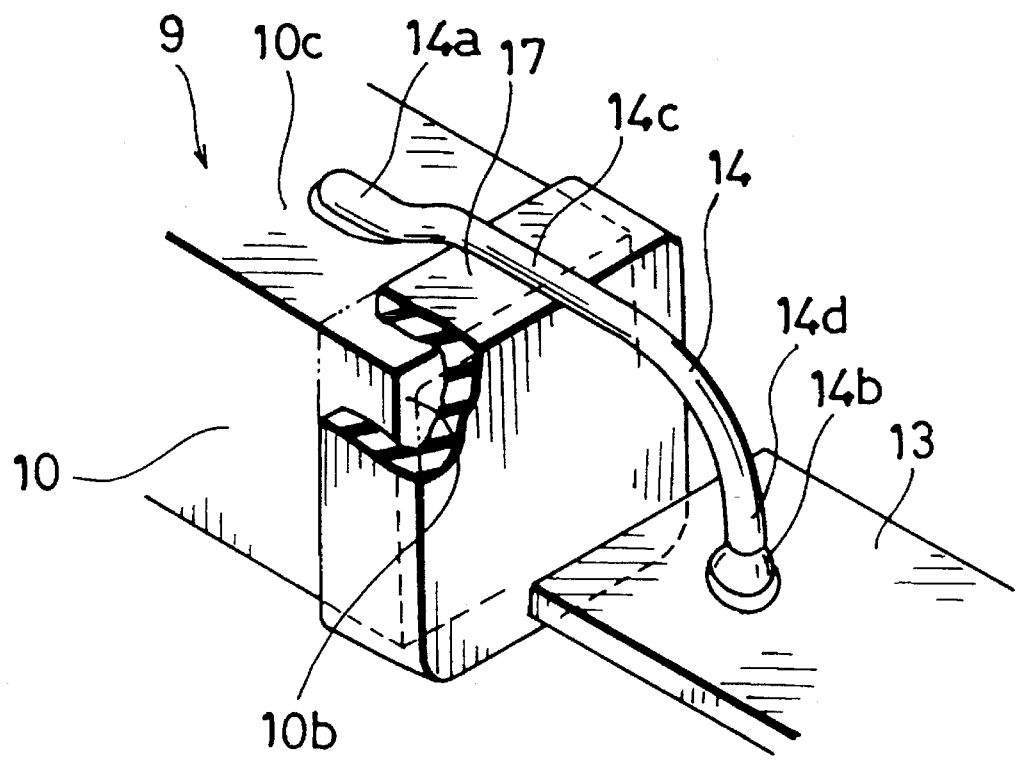
FIG. 2 is a perspective view showing a principal portion of the same capacitor.

Referring first to FIGS. 1 and 2 of the accompanying drawings, there is shown a solid electrolytic capacitor according to a first embodiment of the present invention. The capacitor may be a tantalum capacitor or an aluminum capacitor for example.

The capacitor of the first embodiment comprises a capacitor element 9 which includes a capacitor chip 10 and an anode wire 11. The capacitor chip 10 has a first end face 10a from which the anode wire 11 projects out, a second end face 10b opposite to the first end face 10b, and an upper side face 10c between the first and second end faces 10a, 10b. The capacitor chip 10 may be a compacted and sintered mass of tantalum powder for example, in which case the anode wire 11 is also made of tantalum.

The anode wire 11 of the capacitor element 9 is electrically connected to a metallic anode lead 12. Further, the chip 10 of the capacitor element 1 is electrically connected to a metallic cathode lead 13 through a safety fuse wire 14. The fuse wire 14 may be an overcurrent fuse which breaks upon passage of an overcurrent, or a temperature fuse which is melt-cut at a predetermined high temperature.

The fuse wire 14 has a first end 14a bonded to the upper side face 10c of the chip 10 at a position remote from the second end face 10b, and a second nail head end 14b bonded to the cathode lead 13. Further, the fuse wire 14 has a horizontal portion 14c (see FIG. 2) extending substantially in parallel to the upper side face 10c of the chip 10, and a vertical portion pole 14d (see also FIG. 2) extending substantially perpendicularly to the cathode lead 13.

The fuse wire 4 is partially enclosed in a relatively soft elastic resin member 16 which works as an arc-extinguishing element. Further, an insulating layer 17 is formed at least on the upper side face 10c of the chip 10 adjacent to the second end face 10b for contacting and supporting the horizontal intermediate portion 14c of the fuse wire 14. According to the illustrated embodiment, the insulating layer 17 is in the form of a cap fitted on the second end face 10b of the chip 10 and extending to all of the side faces (including the upper side face 10c) of the chip 10.

A package 15 of a synthetic resin encloses the abovementioned components with the respective leads 12, 13 partially projecting therefrom. The projecting portions of the respective leads 12, 13 are bent toward the underside of the package 15 for conveniently mounting to a surface of a printed circuit board (not shown).

According to the arrangement described above, the insulating layer or cap 17 contacts and supports the horizontal intermediate portion 14c of the safety fuse wire 14. Thus, the fuse wire 14 is prevented from unexpectedly sagging into direct contact with the chip 10, so that it is possible to prevent the fusing or melting property of the fuse wire 14 from suffering variations which might result from such sagging.

Further, due to the insulating and supporting functions provided by insulating layer 17, the horizontal intermediate portion 14c of the safety fuse wire 14 need only be raised from the upper side face 10c of the chip 10 by a small amount W corresponding to the thickness of the insulating layer 17. Thus, it is unnecessary to greatly increase the thickness dimension R of the package portion above the upper side face 10c of the chip 10, and the height H of the resin package 15 can be made smaller than conventionally possible.

Further, since the vertical portion 14d of the fuse wire is substantially perpendicular to the cathode lead 13, the fuse wire 14 as a whole can be elongated without unduly spacing the cathode lead 13 from the second end face 10b of the chip 10. Thus, the length L1 of the capacitor as a whole can be rendered smaller than conventionally possible.

Figure 3:
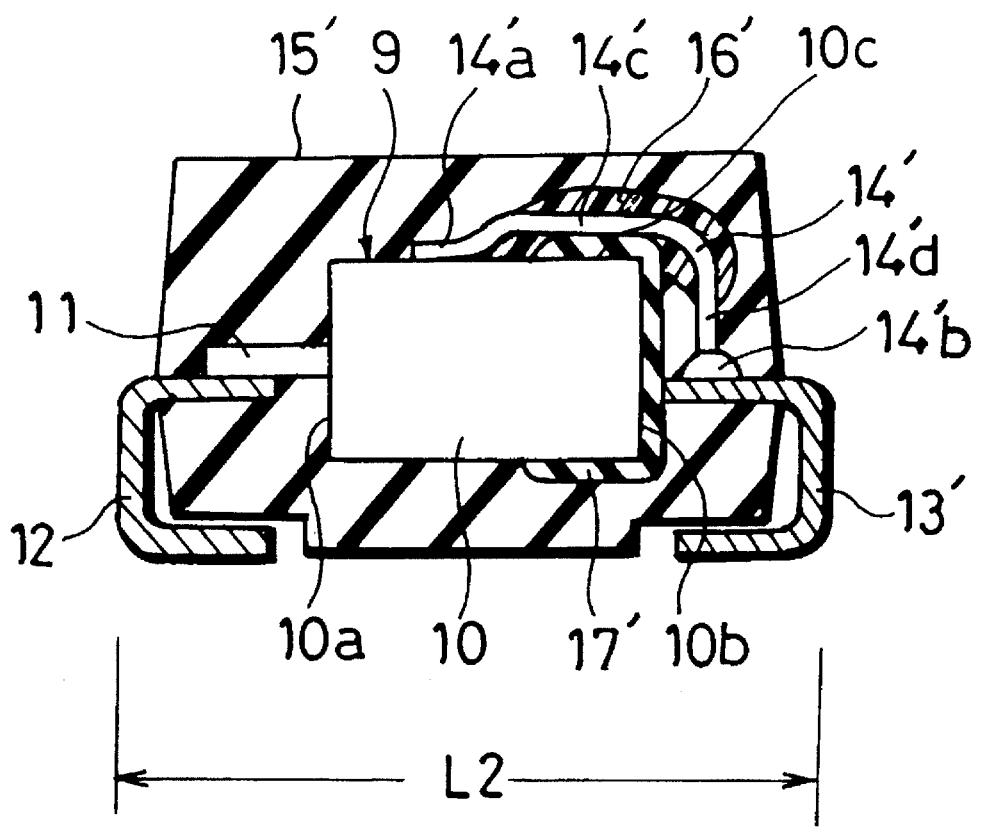
FIG. 3 is a front view, in vertical section, showing a solid electrolytic capacitor according to a second embodiment of the present invention.

FIG. 3 shows a solid electrolytic capacitor according to a second embodiment of the present invention. The capacitor of this embodiment is similar to that of the first embodiment but differs therefrom only in the following points.

First, a cathode lead 13 is held in direct contact with an insulating cap 17' which is fitted on the second end face 10b of the capacitor chip 10 and extends onto the upper side face 10c of the chip 10. As a result, a resin package 15' can be reduced in size, and the capacitor as a whole is made to have a reduced length L2.

Secondly, a safety fuse wire 14' enclosed in a soft elastic resin member 16' is positionally shifted, in its entirety, toward the first end face 10a of the chip 10, as compared to the safety fuse wire 14 of the first embodiment. Such positional shifting is necessary to prevent a length reduction of the fuse wire 14' which would be otherwise caused by positional shifting of the cathode lead 13'. Like the fuse wire 14 of the first embodiment, the fuse wire 14' of the second embodiment also has a first end 14a' bonded to the chip 10, a second end 14b' bonded to the cathode lead 13', a substantially horizontal portion 14c', and a substantially vertical portion 14d'.

As a result of the positional shifting described above, the first end 14a' of the fuse wire 14' is bonded to the upper side face 10c of the chip 10 at a position closer to the first end face 10a than to the second end face 10b. Further, the vertical portion 14d' of the fuse wire 14' is made to extend adjacent to the second end face 10b of the chip 10. Thus, the entirety of the fuse wire 14' can be located very close to the chip 10, so that it can be rendered very sensitive to the heat of the chip 10 when used as a temperature fuse.

Figure 4:
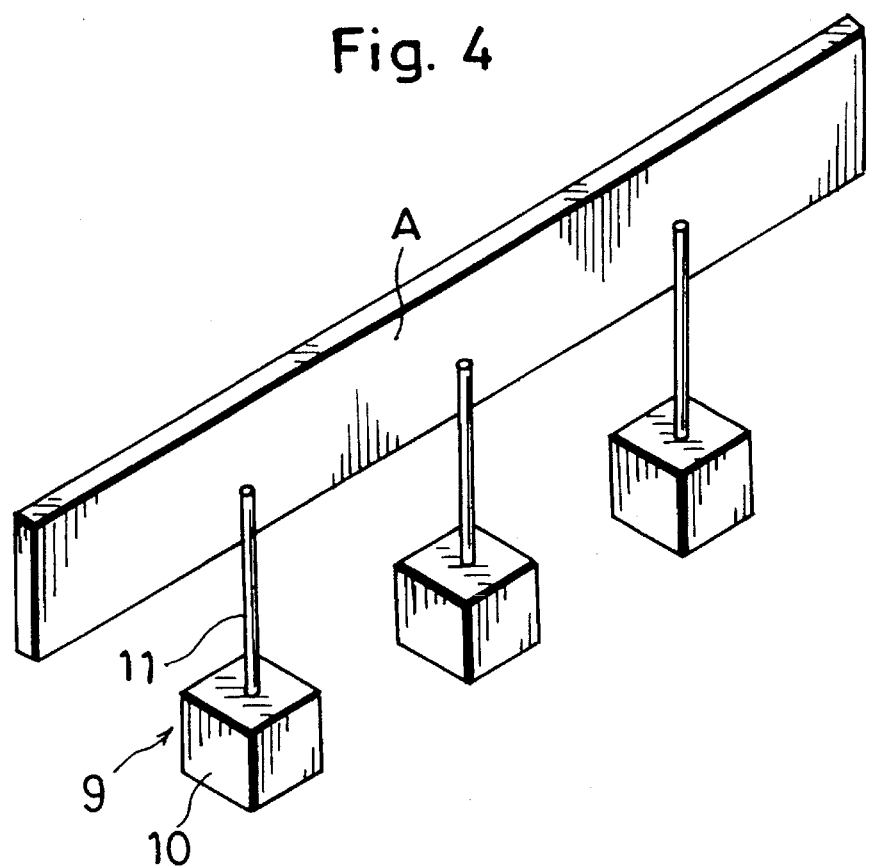
FIG. 4 is a perspective view showing a plurality of capacitor elements as supported by a common support bar for making the capacitor shown in FIG. 1 or 3.

In manufacture, a plurality of capacitor elements 9 are supported by a common metallic support bar A which is bonded to the respective anode wires 11 of the capacitor elements 9, as shown in FIG. 4. In this condition, the respective capacitor chips 10 (which may be a compacted mass of tantalum powder) of the capacitor elements 9 are first subjected together to formation of a dielectric substance (e.g. tantalum pentoxide) by anodic oxidation in a suitable chemical solution, then to formation of a solid electrolyte (e.g. manganese dioxide) by immersing in a manganese nitrate solution, and then to formation of a cathode electrode layer on the respective chips 10. These process steps per se are conventional.

Figure 5:
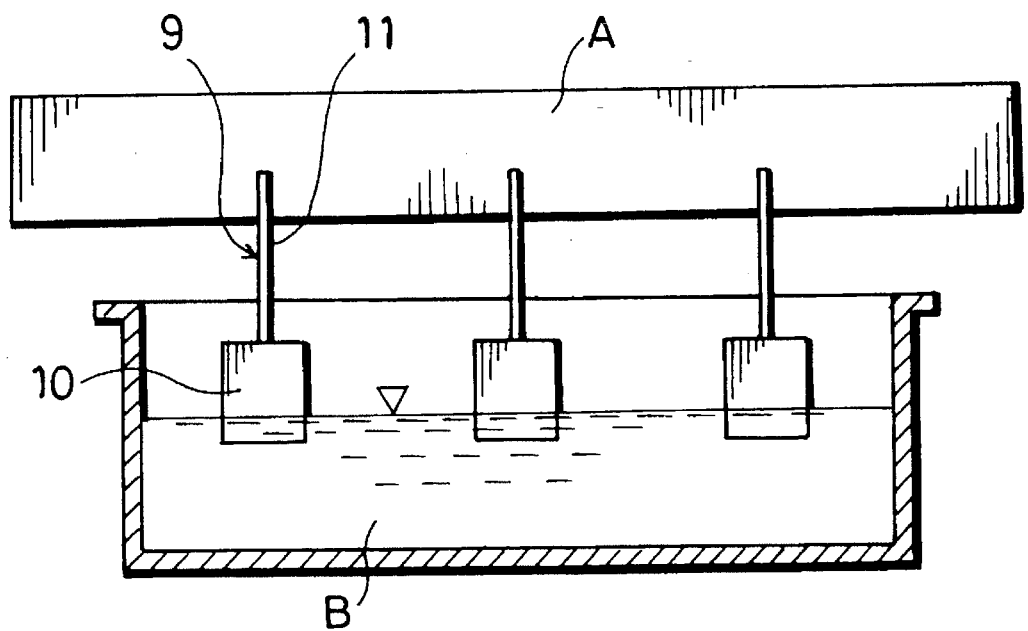
FIG. 5 is a front view showing the supported capacitor elements undergoing formation of an insulating layer.
Figure 6:
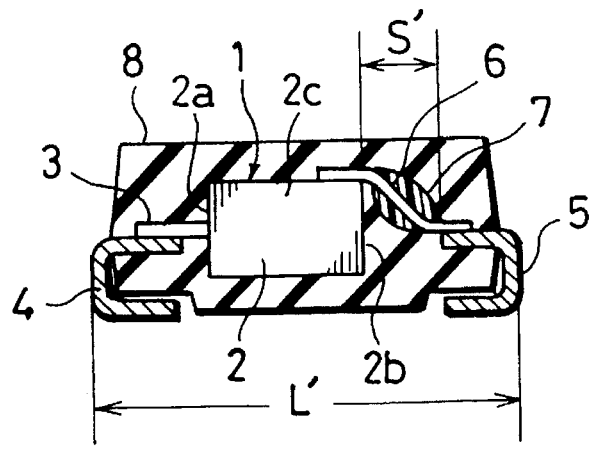
FIG. 6 is a front view, in vertical section, showing a prior art solid electrolytic capacitor.
Figure 7:
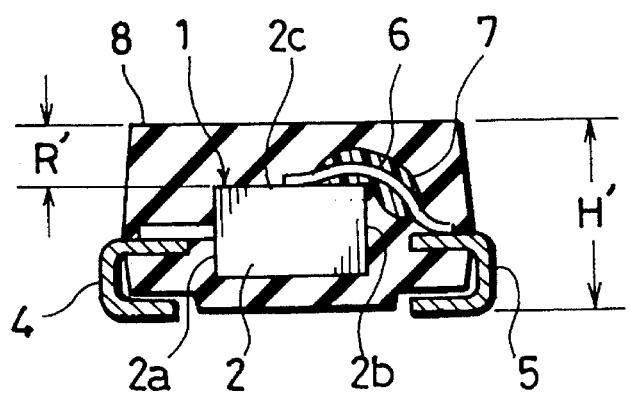
FIG. 7 is a front view, in vertical section, showing another prior art solid electrolytic capacitor.
Figure 8:
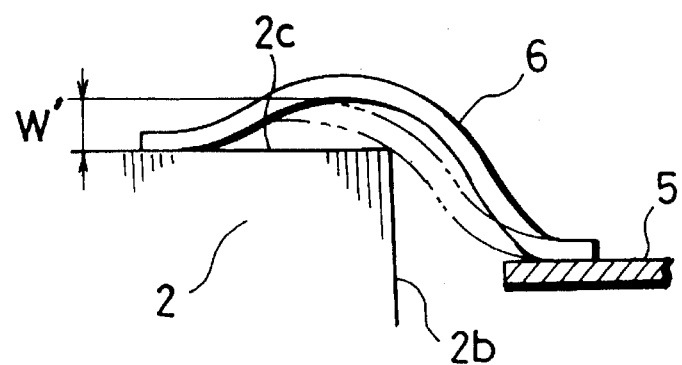
FIG. 8 is an enlarged fragmentary view illustrating the problem encountered in the capacitor of FIG. 7.

After the above-described steps, the respective chips 10 supported together by the common support bar A are immersed in a resin liquid B, as shown in FIG. 5. As a result, an insulating layer (see the element 17, 17' in FIG. 1 or 3) is formed on each of the chips 10. Apparently, the use of the common support bar A is advantageous in that the step of forming the insulating layer can be performed conveniently and efficiently.

The present invention being thus described, it is obvious that the same may be varied in many ways. For instance, the insluating layer 17, 17' may be formed not to cover the second end face 10b of the chip 10 so long as it covers the upper side face 10c adjacent to the second end face 10b. Such variations are not to be regarded as a departure from the spirit and scope of the present invention, and all such modifications as would be obvious to those skilled in the art are intended to be included within the scope of the following claims.

I claim:

1. A solid electrolytic capacitor comprising:

a capacitor element including a chip and an anode wire projecting from a first end face of the chip, the chip having a second end face opposite to the first end face and a side face between the first and second end faces;

an anode lead electrically connected to the anode wire;

a cathode lead paired with the anode lead;

a safety fuse wire having a first end electrically connected to the side face of the chip, and a second end electrically connected to the cathode lead; and a resin package enclosing the capacitor element, part of the anode lead, part of the cathode lead and the fuse wire;

wherein an insulating layer is formed at least on the side face of the chip adjacent to the second end face thereof for contacting and supporting the safety fuse wire, the insulating layer extending on the side face of the chip only to a position short of the first end of the fuse wire to form a clearance between the fuse wire and the side face of the chip; and wherein the fuse wire is partially enclosed in an elastic resin member which is embedded in the resin package, the elastic resin member filling the clearance between the fuse wire and the side face of the chip.

2. The capacitor according to claim 1, wherein the fuse wire has a horizontal portion extending substantially in parallel to the side face of the chip in contact with the insulating layer, and a vertical portion extending substantially perpendicularly to the cathode lead.

3. The capacitor according to claim 1, wherein the insulating layer also covers the second end face of the chip.

4. The capacitor according to claim 3, wherein the cathode lead is held in direct contact with the insulating layer.

5. The capacitor according to claim 4, wherein the first end of the fuse wire is bonded to the side face of the chip at a position closer to the first end face than to the second end face.

\* \* \* \* \*